United States Patent [19]
Taylor

[11] Patent Number: 5,045,808
[45] Date of Patent: Sep. 3, 1991

[54] SINGLE-STAGE HIGH-GAIN AMPLIFIER

[75] Inventor: Stewart S. Taylor, Beaverton, Oreg.

[73] Assignee: TriQuint Semiconductor, Inc., Beaverton, Oreg.

[21] Appl. No.: 485,356

[22] Filed: Feb. 26, 1990

[51] Int. Cl.[5] .............................................. H03F 1/34
[52] U.S. Cl. .................................... 330/277; 330/293; 330/311
[58] Field of Search ......................... 330/277, 293, 311

[56] References Cited
U.S. PATENT DOCUMENTS
4,881,044 11/1989 Kinoshita et al. ............... 330/277 X FOREIGN PATENT DOCUMENTS
126306 7/1984 Japan ................................... 330/277

OTHER PUBLICATIONS
Osafune et al., "A Low-Noise GaAs Monolithic Broadband Amplifier Using a Drain Current Saving Technique", *IEEE Transactions on Microwave Theory and Techniques*, vol. MTT-33, No. 6, Jun. 1985, pp. 543-545.

Primary Examiner—James B. Mullins
Attorney, Agent, or Firm—Paul S. Angello; Peter J. Meza

[57] ABSTRACT

A high-gain solid-state amplifier (20) includes an amplification stage including a transistor ($Q_1$) having a current-dependent transconductance value. The transistor is operatively connected to a load resistor ($R_{L1}$) through which a load current ($I_1$) flows. The value of the load resistor together with the transconductance value affects the voltage gain of the amplifier. A resistor ($R_2$) provides a supplemental bias current ($I_2$) to a current summing node (A). The current summing node sums the load current and the supplemental bias current and provides the transistor with a total current ($I_d$) that affects the transconductance value. The value of the supplemental bias current is chosen to supplement the load current to provide a predetermined total current so that the voltage gain may be adjusted by adjusting the load resistor without changing the transconductance value. Alternatively, the amplifier voltage gain may be enhanced by increasing the supplemental bias current and transistor size in a known manner while maintaining a fixed value of the load resistor.

19 Claims, 1 Drawing Sheet

SINGLE-STAGE HIGH-GAIN AMPLIFIER

Field of the Invention

The present invention relates to electronic signal amplifiers and, in particular, to a single-stage solid-state amplifier that provides high gain and has low noise characteristics.

BACKGROUND OF THE INVENTION

Each amplification stage of a multistage amplifier introduces noise and phase shift into the signal it amplifies. It is, therefore, desirable to use an amplifier having few amplification stages with high gain and low noise. Currently available single-stage amplifiers implemented with short-channel field effect transistors (FETs) provide relatively low amounts of gain or exhibit poor noise performance.

FIG. 1 shows a prior art low-gain amplifier circuit 10 having a single amplification stage comprised of FETs $Q_1$ and $Q_2$ connected in cascode arrangement. An input signal, $V_i$, which is developed from the current delivered by an input current source, $I_i$, is applied to the gate terminal of $Q_1$. A FET transistor $Q_3$ functions as a current source for biasing diodes $D_3$ and $D_4$ that ensure a sufficient drain-to-source voltage across $Q_1$.

A FET $Q_4$ and diodes $D_5$, $D_6$, $D_7$, $D_8$, and $D_9$ form a source follower and DC voltage level shifter. A FET $Q_5$ functions as a current source for $Q_4$, and diodes $D_1$ and $D_2$ drop a DC voltage, ensuring sufficient drain-to-source voltage for $Q_5$. A feedback resistor, $R_f$, connected between the drain terminal of $Q_5$ and the gate terminal of $Q_1$ may be used to form a transimpedance amplifier whose bandwidth is dependent on the voltage gain of the amplifier. The bandwidth of such a transimpedance amplifier is approximately equal to $A_v/(2\pi R_f C)$, where $A_v$ is the voltage gain of the amplifier and $C$ is the total input capacitance. Each of the transistors $Q_1$, $Q_2$, and $Q_5$ is a depletion-mode gallium arsenide (GaAs) metal semiconductor field effect transistor (MESFET).

A resistor $R_L$, which is represented in FIG. 1 as a variable resistor, is connected between $V_{dd}$ and the drain terminal of $Q_2$ to provide a passive load resistance for amplifier 10. A resistive load provides amplifier 10 with lower noise characteristics than those achievable with an active load consisting of a transistor connected as a current source. An active transistor load would typically have channel noise comparable to that of $Q_1$ and, therefore, degrade the noise performance by approximately 3 dB. On the other hand, a resistive load has thermal noise that is typically three to ten times smaller than the channel noise of a transistor load. The voltage gain, $A_v$, measured from the gate terminal of $Q_1$ to the drain terminal of $Q_2$, is approximately equal to the transconductance $g_m$ of $Q_1$ multiplied by $R_L$, as expressed in equation (1) below:

$$A_v = -g_m R_L. \tag{1}$$

It is known that the transconductance, $g_m$, is proportional to the square root of the current $I_d$ that enters the drain of $Q_1$, which is expressed in equation (2), below:

$$g_m \alpha (I_d)^{\frac{1}{2}}. \tag{2}$$

Equation (1) indicates that $A_v$ increases as the value of $R_L$ increases. An increase in the value of $R_L$ causes a corresponding decrease in the value of $I_d$, which flows through $R_L$. Equation (2) indicates, however, that a decrease in the value of $I_d$ decreases the value of $g_m$, thereby counteracting the increase in $A_v$ caused by an increase in the value of $R_L$. Therefore, according to equations (1) and (2), $A_v$ does not increase linearly with an increase in $R_L$. As a consequence, the maximum value of $A_V$ is lower than desired. Moreover, as $R_L$ increases in value, the output resistance present at the drain of $Q_2$ lowers the effective load resistance present at the drain terminal of $Q_2$, thereby further limiting the overall gain, $A_v$.

A practical implementation of circuit 10 that provides $A_v = -13$ would include values of $R_L = 500$ ohms, $V_{ss} = -5$ volts, $V_{dd} = +5$ volts, and $I_d = 10$ milliamperes. The output impedance, $R_O$, of common gate stage $Q_2$ would be approximately 3.25 kilohms. Transistor $Q_1$ would have $g_m = 30$ millimhos, gate width $= 500$ microns, $f_T = 15$ GHz, and pinchoff voltage $V_p = -0.7$ volts.

SUMMARY OF THE INVENTION

An object of the invention is, therefore, to provide a single-stage amplifier with high gain and low noise characteristics.

A further object of the invention is to provide a single-stage, high-gain amplifier in a short-channel, high-speed technology such as GaAs that can be suitably employed as a transimpedance amplifier.

A high-gain solid-state amplifier includes an amplification stage with a transistor having a current dependent transconductance value. The transistor is operatively connected to a load resistor through which a load current flows. The value of the load resistor together with the transconductance value of the transistor affects the voltage gain of the amplifier. A bias resistor provides a supplemental bias current to a current summing node. The current summing node sums the load current and the supplemental bias current and provides the transistor with a total current that determines the transconductance value. The value of the supplemental bias current is chosen to supplement the load current to provide a predetermined total current so that the voltage gain may be adjusted by adjusting the load resistor without changing the transconductance value of the transistor.

Alternatively, the amplifier voltage gain may be enhanced by increasing the supplemental bias current and transistor size in a known manner while maintaining a fixed value of the load resistor.

DETAILED DESCRIPTION OF THE PREFERRED EMBODIMENT

Figure 1:
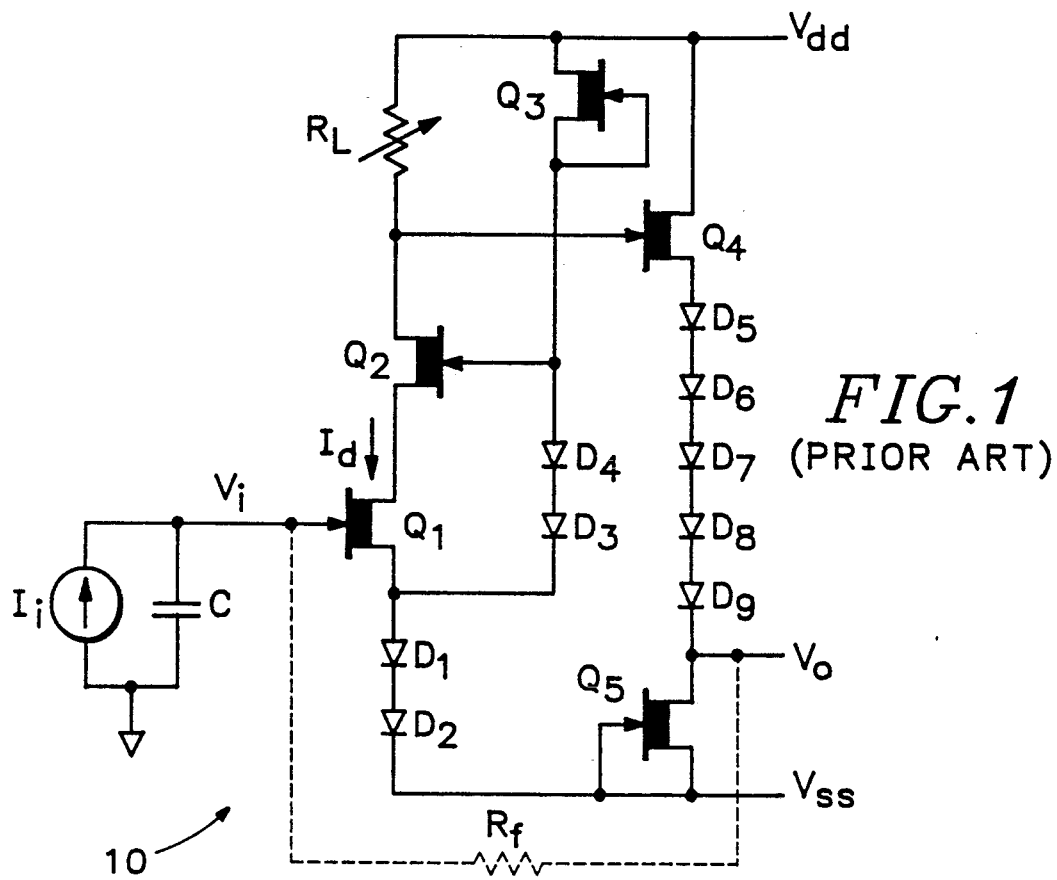
FIG. 1 shows a prior art single-stage amplifier circuit.
Figure 2:
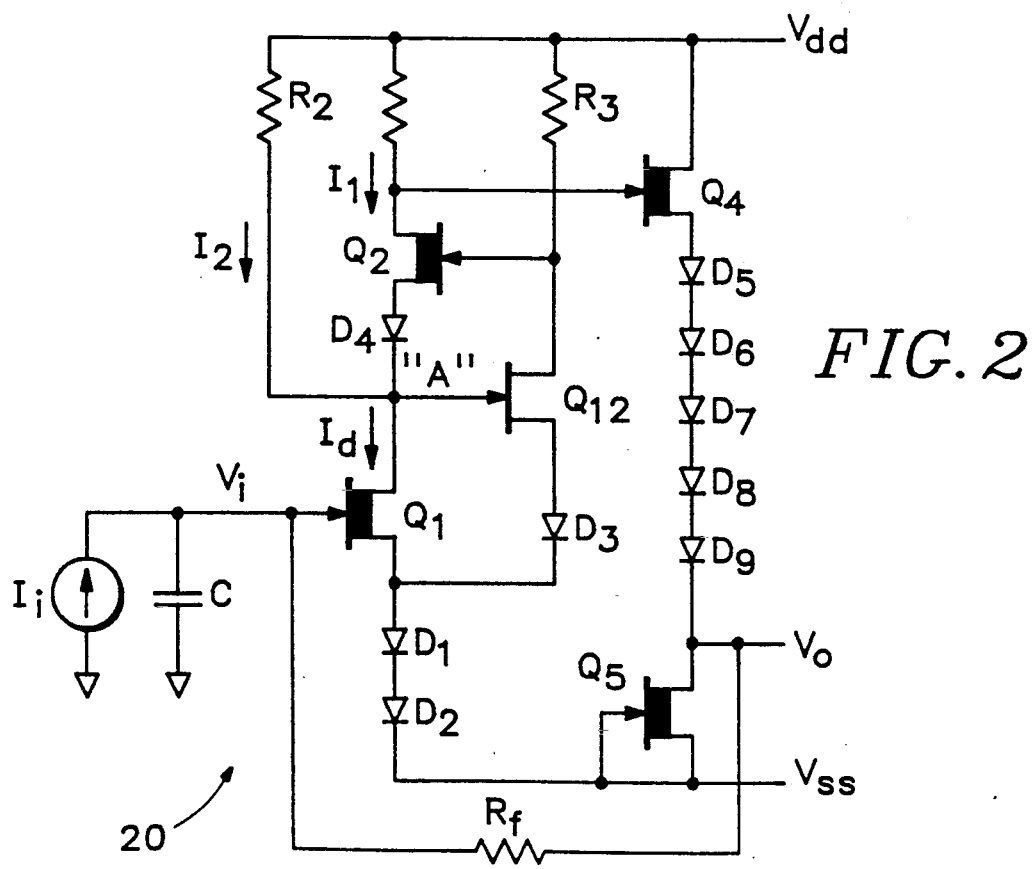
FIG. 2 shows a high-gain, low-noise single-stage amplifier circuit configured in accordance with the present invention.

FIG. 2 shows a high-gain, low-noise amplifier circuit 20 configured in accordance with the present invention. Amplifier 20 may be used, for example, as the input amplification stage of a very high-gain multi-stage amplifier or as a single-stage transimpedance amplifier. Transistors $Q_1$, $Q_2$, $Q_4$, and $Q_5$ are of the same type shown in FIG. 1. The implementation of the invention is not, however, limited to GaAs devices or any other particular type of transistor. A resistor $R_3$, which is connected between $V_{dd}$ and the gate terminal of $Q_2$, replaces the transistor $Q_3$ configured as an active load in FIG. 1.

A bias resistor $R_2$ and a transistor $Q_{12}$, which is preferably of the enhancement mode MESFET type, are added to amplifier circuit 10 in FIG. 1. Diodes $D_3$ and $D_4$, which are reconfigured to accommodate the addition of $Q_{12}$, shift the DC voltage levels at the source terminals of $Q_1$ and $Q_2$ to provide the proper operating drain-to-source voltages for $Q_1$ and $Q_{12}$. Amplifier circuit 20 operates in a manner that substantially eliminates the dependence of $I_d$ on the value of $R_{L1}$ and increases the impedance looking into the drain of $Q_2$, thereby permitting the selection of $R_{L1}$ without affecting the value of $g_m$ for $Q_1$.

As shown in FIG. 2, a current $I_d$ flows into the drain of $Q_1$; a current $I_1$ flows through resistor $R_{L1}$, which is connected between $V_{dd}$ and the drain of $Q_2$; and a current $I_2$ flows through resistor $R_2$, which is connected between $V_{dd}$ and the drain of $Q_1$. Because of the relatively high input impedance of $Q_{12}$, current $I_d$ is essentially equal to $I_1+I_2$. Thus, $I_d$ flows out of node "A" and $I_1+I_2$ flows into node "A."

A negative feedback loop is created by the connection of the gate and drain terminals of $Q_{12}$ to the respective source and gate terminals of $Q_2$ as shown. This feedback loop provides a low input impedance at node "A" and a high output impedance, $R_0$, into the drain of $Q_2$. The presence of $Q_{12}$ causes the output impedance $R$ to be comparable to or greater than $R_{L1}$, notwithstanding the presence of $R_2$. The absence of $Q_{12}$ would result in $R_2$ lowering the value of the impedance presented at the drain of $Q_2$ and, therefore, the voltage gain $A_v$, of the amplifier. If $R_2$ were replaced by a higher impedance current source transistor, the noise performance of the circuit would be degraded. Resistor $R_2$ provides a current $I_2$ that affects the value of $I_d$ and the value of $g_m$ of $Q_1$. Therefore, selecting a value of $R_{L1}$, and thereby changing the value of $I_1$, need not appreciably change the value of $I_d$. This is so because the value of $R_2$ can be changed to provide a corresponding change in $I_2$ that offsets a change in $I_1$ and thereby maintains $I_d$ and $g_m$ at constant values. The result is that the gain, $A_v$, from the gate of $Q_1$ to the drain of $Q_2$ can be made much larger than that of amplifier circuit 10 of FIG. 1.

The gate width of transistor $Q_2$ is typically made much smaller than that of $Q_1$, such that the output impedance of $Q_2$ is correspondingly higher. The impedance $R_0$ is approximately inversely proportional to the width of $Q_2$ and is proportional to the voltage gain provided by $Q_{12}$.

The voltage gain, $A_v$, of amplifier 20 is approximately equal to $g_m$ of $Q_1$ multiplied by $R_{L1}$ in parallel with $R_0$, as expressed in equation (3), below:

$$A_v = -g_m [R_0 81 R_{L1}]. \tag{3}$$

In equation (3), $R_0$ is made comparable to or larger than $R_{L1}$, which is made large to increase the voltage gain, $A_v$. The negative feedback provided by $Q_{12}$ keeps $R_0$, and thus $A_v$, high. The value of $R_0$ in the present invention is typically five to ten times that achievable by the prior art circuit 10. The gain, $A_v$, from the gate of $Q_1$ to the drain of $Q_2$ can be greater than 100 for the component values given with reference to amplifier circuit 10, and for $R_2=850$ ohms, $R_3=2.5$ kilohms, $I_d=10$ milliamperes, $I_1=1$ milliamperes, and $R_{L1}=5$ kilohms. Without $Q_{12}$, $R_2$ would lower $R_0$ and thereby counteract the increase in $R_{L1}$ and therefore $A_v$.

Although the preferred operation entails the use of positive and negative power supplies for $V_{dd}$ and $V_{ss}$, respectively, the performance of amplifier circuit 20 is also superior to that of amplifier circuit 10 when biased by a single power supply.

Amplifier 20 may be also used with a feedback resistor, $R_f$, as indicated previously with reference to amplifier circuit 10. By using resistors $R_{L1}$, $R_2$, and $R_3$ rather than active load/biasing transistor current sources, the noise performance of the amplifier 20 is enhanced. This increases the sensitivity for transimpedance amplifier applications. For transimpedance amplifiers with wide bandwidth and high sensitivity, it is desirable to achieve a high voltage gain in a single stage. This minimizes phase shift and thereby enhances stability and allows the use of a large feedback resistor, $R_f$.

Transistor $Q_{12}$ could also be a depletion device, which may require that extra diodes be connected between the source of $Q_{12}$ and the anode of $D_3$, and between the source of $Q_2$ and the anode of $D_4$. These diodes would ensure sufficient drain-to-source voltage across $Q_1$ and $Q_{12}$.

While the present invention has been described with respect to a preferred embodiment, it' will be understood that various alterations may be made thereto without departing from the scope of the invention. For example, the gain, $A_v$, can be increased by keeping $R_{L1}$ and $I_1$ at constant values and increasing the value of current $I_2$ and the ratio of the width to the length of $Q_1$. Ordinarily, the gate length is chosen to be as small as possible and the gate width is selected as needed. This approach would also provide an independent adjustment of the load applied to the drain terminal of $Q_2$ and the value of $g_m$ for $Q_1$ without substantially raising the output impedance of $Q_2$. The scope of the invention should, therefore, be determined only by the following claims.

I claim:

1. A high-gain, low-noise solid-state amplifier, comprising:

an amplification stage including a transistor through which a transistor current flows and having a transistor current-dependent transconductance, the transistor operatively coupled to a load impedance to provide a voltage gain that approximately equals the transconductance of the transistor times the load impedance;

supplemental bias current means for providing a supplemental bias current that forms a component of the transistor current, the supplemental bias current affecting the transconductance of the transistor and enabling a change in the voltage gain with substantial mutual independence of the transconductance of the transistor and the load impedance; and negative feedback means electrically connected to the transistor for providing the amplification stage with an output impedance of relatively high value and thereby permitting the load impedance to be of relatively high value to increase the voltage gain.

2. The amplifier of claim 1, wherein the supplemental bias current means comprises a passive resistive element.

3. The amplifier of claim 1, wherein the amplifier has an input and an output and further comprises a feedback resistive element electrically connected between them, thereby to form an amplifier of the transimpedance type.

4. The amplifier of claim 1, wherein the transistor constitutes a first transistor and the amplification stage further includes a second transistor configured in cascode arrangement with the first transistor.

5. The amplifier of claim 4, wherein the first and second transistors are of the field effect type, the second transistor having a drain terminal that is electrically connected to the load impedance.

6. The amplifier of claim 5, wherein a load current flows through the load impedance, and further comprising current summing means for summing the load current and the supplemental bias current to produce the transistor current, the current summing means having an impedance value and the second transistor having an impedance at its drain terminal.

7. The amplifier of claim 6, wherein the negative feedback means includes a third transistor electrically connected to the current summing means and to the second transistor.

8. The amplifier of claim 1, wherein a load current flows through the load impedance, and further comprising:
   current summing means for summing the load current and the supplemental bias current to produce the transistor current, and wherein the transistor constitutes a first transistor and wherein the amplifier stage further includes the first transistor; and
   a second transistor having an output terminal and connected in cascode arrangement with the first transistor.

9. The amplifier of claim 8, wherein the negative feedback means comprises a third transistor electrically connected to the current summing means and to the second transistor, the third transistor providing negative feedback for raising the impedance at the output terminal of the second transistor to facilitate adjustment of the load impedance without changing the transconductance value of the first transistor.

10. The amplifier of claim 8, in which the second transistor is of the field effect type, and the output impedence of the second transistor appears at its drain terminal.

11. The amplifier of claim 1, wherein the amplification stage, the load impedance, and the supplemental bias current means are implemented in integrated circuit form.

12. The amplifier of claim 1, wherein the transistor is of the gallium arsenide type.

13. The amplifier of claim 1, wherein the load impedance comprises a resistor.

14. A high-gain, low-noise solid-state amplifier, comprising:
   an amplification stage including a transistor having a current dependent transconductance value, the transistor operatively coupled to a load impedance through which a load current flows, the value of the load impedance together with the transconductance value affecting the voltage gain of the amplifier;
   supplemental bias current means for providing a supplemental bias current whose value is chosen in conjunction with the amount of load current;
   current summing means for summing the load current and the supplemental bias current and for providing to the transistor a total current that affects the transconductance value, the value of supplemental bias current being chosen to supplement the load current to provide a predetermined total current so that the voltage gain may be chosen by adjusting the load impedance without changing the transconductance value of the transistor; and
   negative feedback means electrically connected to the transistor for providing the amplification state with an output impedance of relatively high value and thereby permitting the load impedance to be of relatively high value to increase the voltage gain.

15. A method of providing a high-gain, low-noise solid-state amplifier, comprising:
   providing an amplification stage including a transistor through which a transistor current flows and having a current-dependent transconductance, the transistor operatively coupled to a load impedance to provide a voltage gain that approximately equals the transconductance of the transistor times the load impedance;
   providing a load current of fixed value flowing through the load impedance;
   providing a supplemental bias current that forms a component of the transistor current;
   summing the load current and the supplemental bias current to determine the transistor current and thereby affect the transconductance of the transistor;
   adjusting the size of the transistor to adjust its transconductance and choosing a corresponding value of supplemental bias current to provide a change in the voltage gain of the amplification stage while maintaining the load current at a constant value; and
   providing negative feedback to the transistor to establish an output impedance of relatively high value in the amplification stage and thereby permit the load impedance to be of relatively high value to increase the voltage gain of the amplification stage.

16. The method of claim 15, wherein the transistor is of the field effect type and the adjustment of the transconductance value of the transistor is accomplished by changing the ratio of its gate dimensions.

17. The method of claim 15 in which the step of providing an amplification stage including a transistor includes providing a first transistor and a second transistor configured in cascade arrangement with the first transistor.

18. The method of claim 17 in which the step of providing a supplemental bias current includes providing a passive resistive element electrically connected to the output of the first transistor and to a source of constant voltage.

19. The method of claim 15 in which the step of providing an amplification stage including a transistor includes operatively connecting the transistor to the load impedance wherein the load impedance comprises a resistor.

* * * * *